United States Patent [19]

Halstead

[11] Patent Number: 4,619,042
[45] Date of Patent: Oct. 28, 1986

[54] METHOD FOR ALIGNMENT AND INSERTION OF AN ELECTRIC MODULE

[76] Inventor: William M. Halstead, 709 Yale Ave., Baltimore, Md. 21229

[21] Appl. No.: 744,659

[22] Filed: Jun. 14, 1985

Related U.S. Application Data

[63] Continuation of Ser. No. 535,051, Sep. 23, 1983, abandoned.

[51] Int. Cl.⁴ .............................................. B23P 19/00
[52] U.S. Cl. ....................................... 29/837; 29/741; 29/758; 29/271
[58] Field of Search ............. 29/741, 270, 271, 233.5, 29/172, 758, 739, 837, 832; 145/46; 294/7; D7/99, 102, 106, 142; 30/124

[56] References Cited

U.S. PATENT DOCUMENTS

| | | | |
|---|---|---|---|
| D. 272,119 | 1/1984 | Steiner | D7/102 |
| 3,091,852 | 4/1963 | De Larber | 30/172 |
| 3,225,432 | 12/1965 | Widman | 29/429 |
| 3,442,430 | 5/1969 | Ackerman et al. | 227/2 |
| 3,538,580 | 11/1970 | Bruner | 29/741 X |
| 3,602,971 | 9/1971 | Halstead | 29/741 |
| 3,628,244 | 12/1971 | Halstead | 29/626 |
| 3,688,393 | 9/1972 | Halstead | 29/626 |
| 3,757,406 | 9/1973 | Bezar | 29/741 |
| 3,875,636 | 4/1975 | Shultz, Jr. et al. | 29/741 |
| 3,877,143 | 4/1975 | Montesi | D7/142 X |
| 3,896,533 | 7/1975 | Ullman et al. | 227/140 |
| 4,179,803 | 12/1979 | Wolkert | 29/741 |
| 4,286,380 | 9/1981 | Blount | 29/741 |
| 4,375,719 | 3/1983 | Kent | 29/747 |

Primary Examiner—Frederick R. Schmidt
Assistant Examiner—Steven P. Schad
Attorney, Agent, or Firm—Munson H. Lane, Jr.

[57] ABSTRACT

A method applying a tool adapted to facilitate alignment and insertion of rows of leads of an electronic module into corresponding rows of terminals or connector block sockets or apertures associated with a circuit board. The tool has an elongated planar blade; an offset handle; rows of opposed slots extending through the longitudinal edges of the blade; and the slots being dimensioned and transversely and longitudinally spaced so as to accommodate said leads therein and further being manipulatable whereby to straighten and align said leads for said insertion or mounting of the module.

5 Claims, 5 Drawing Figures

U.S. Patent    Oct. 28, 1986    4,619,042
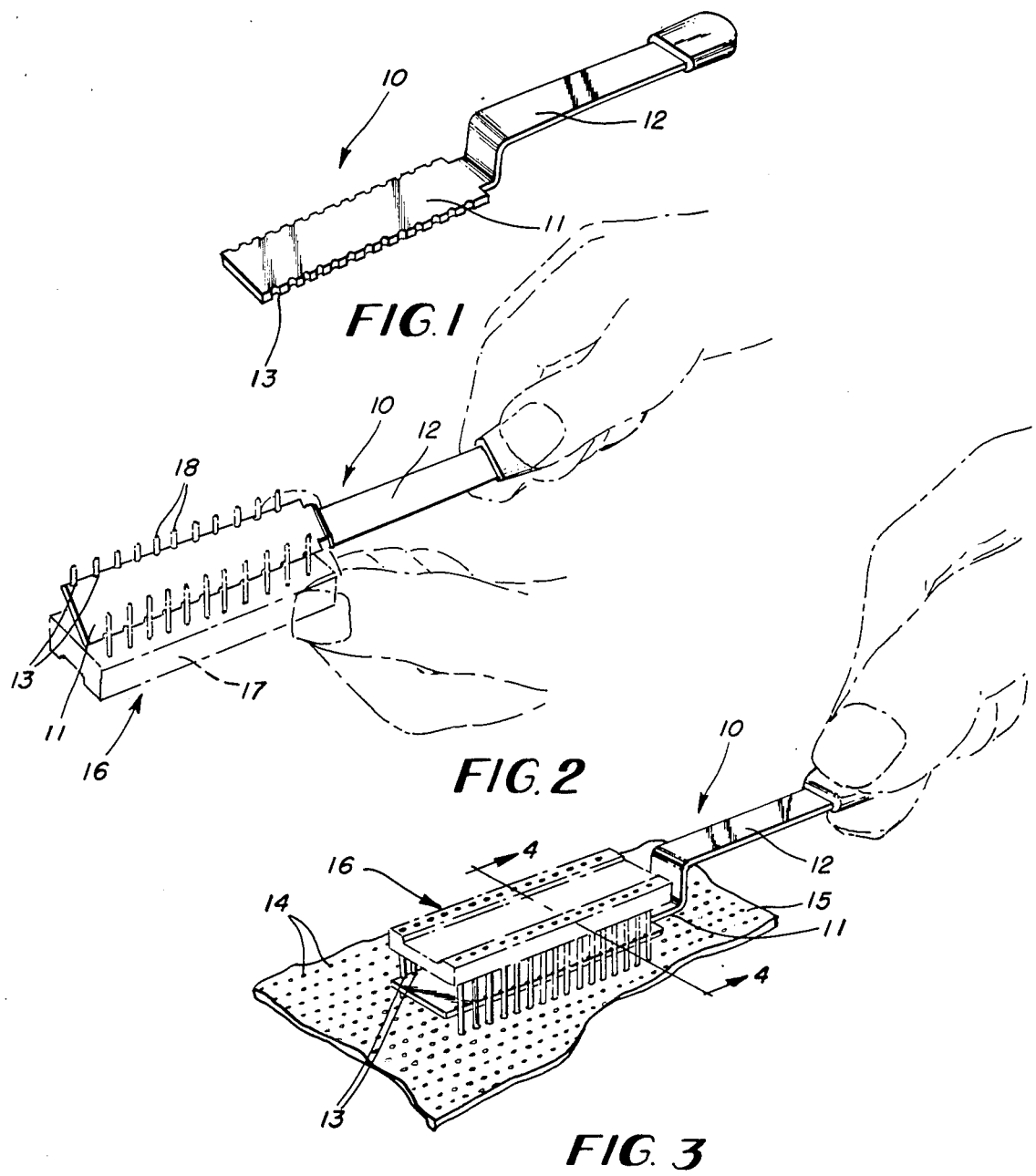
FIG. 1
FIG. 2
FIG. 3
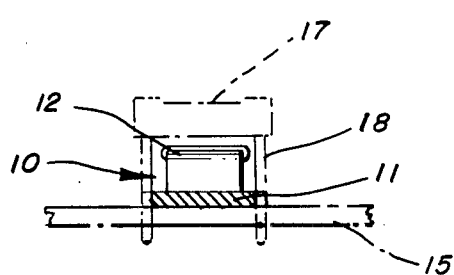
FIG. 4
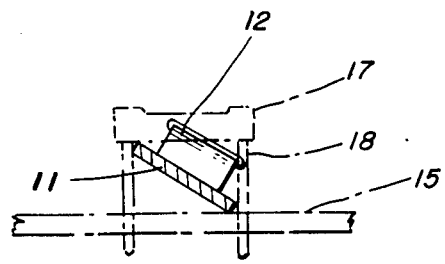
FIG. 5

METHOD FOR ALIGNMENT AND INSERTION OF AN ELECTRIC MODULE

This application is a continuation of application Ser. No. 535,051, filed Sept. 23, 1983, now abandoned.

BACKGROUND OF THE INVENTION

This invention relates to a device for mounting an electronic module onto a circuit board. The module conventionally comprises a spine member from which unidirectionally extends generally parallel rows of electrical leads. The leads are conventionally configured as round wires or flat strips or cross-sectional variations thereof.

In the assembling of such a module to a circuit board, wherein said leads are received into a connector block or terminals mounted on the circuit board or into the sockets of the circuit board, a problem is encountered with respect to alignment of the leads. The lead elements are in generally correct position at the body or spine of the module but the rows of lead extensions may require spreading and individual lead extensions and free ends thereof require both transverse and longitudinal straightening and alignment with respect to the apertures in the circuit board.

Manual manipulation of the leads for assembling is time costly and frequently results in damage to and discarding of the module. Even when only minimal manipulation is required for proper alignment of leads and circuit board apertures, such minimal manipulation may be precluded because of spatial limitation.

Known tools for the assembling purpose are generally of the grip or plier type, are relatively complex and do not adequately provide or facilitate rapid spreading, straightening and positioning of the module leads. The following U.S. patents are illustrative of the prior art:

U.S. Pat. No. 3,225,432 Widman,
U.S. Pat. No. 3,757,406 Bezar,
U.S. Pat. No. 3,896,533 Ullman,
U.S. Pat. No. 4,179,803 Wolkert,
U.S. Pat. No. 4,286,380 Blount.

The serrated aligning tool of U.S. Pat. No. 3,225,432, Widman, discloses a tool with serrated edges but for a purpose unrelated to the purpose of the present invention.

SUMMARY OF THE INVENTION

The objects of the invention are to provide a method to facilitate the aforesaid assembly operation that is inexpensive, is simple in structure, does not require moving parts or exotic materials of fabrication, requires only minimal instruction in the use thereof and may be conveniently utilized at spatially "tight" locations.

The method applies a tool that basically comprises an elongated, planar blade member whose elongated sides have rows of slots extending therethrough.

BRIEF DESCRIPTION OF THE DRAWINGS

The invention will be more readily understood by reference to the accompanying drawings and the following detailed description in which specific embodiments of the invention are set forth by way of illustration and not by way of limitation, it being understood that numerous additional modifications and variations may be resorted to without departing from the spirit of the invention in its broadest aspects as will be apparent to those skilled in the art.

In the drawings:

FIG. 1 is a perspective view of the alignment and insertion tool.

FIG. 2 is a perspective view of the tool in an initial position of operative association with the module.

FIG. 3 is a perspective view of the tool, module and circuit board before withdrawal of the tool from the partially mounted module.

FIG. 4 is a cross-section on line 4—4 of FIG. 3.

FIG. 5 is a cross-section as in FIG. 4 but showing the tool rotated prior to extraction thereof.

DESCRIPTION OF THE INVENTION

Referring to FIGS. 1-3, the alignment and insertion tool 10 has an elongated, planar blade 11 and offset therefrom, an elongated handle 12. The elongated edges of the blade have opposed notches or slots 13 therethrough. The slots have predetermined dimensions and predetermined transverse and longitudinal spacings there between whereby to align with rows of apertures 14 of a circuit board 15 and to align rows of said leads when the latter are received in the slots.

An electrical device to be mounted on the circuit board is illustrated by a module 16 comprising a spine portion 17 having generally parallel rows of unidirectionally extending electrical leads 18. The rows of leads when properly aligned are adapted to be received in corresponding rows of said circuit board apertures. The rows of leads could of course be received into rows of terminals or the sockets of a connector block.

As illustrated, the slots 13 are configured as half-rounds, the leads as round wires or pins and the circuit board apertures in accordance therewith. Optionally, the slots could be V-shaped or rectangular, the leads could be flat strips or variously cross-sectionally configured and the board or socket apertures fabricated accordingly.

Normally, for module mounting purposes, it is necessary to first straighten and align the leads. Illustrative of such procedure and using the alignment and insertion tool of the invention, reference is made to FIGS. 2 and 3.

In FIG. 2, an operator inserts the tool blade between the rows of leads; the plane of the blade is at an angle to the planes of the rows of leads whereby the innermost line of blade slots engage associated leads. The tool blade is then rotated to a position paralleling the module spine whereby to engage the opposed slots and associated leads. Of course, the leads may be manipulated into said slots. The blade is then translated toward the free ends of the leads, to thereby straighten and align the leads, and the assembled module and tool is moved relative to the associated circuit board for partial entry of the leads into the aforesaid apertures, terminals or sockets; the assemblage of parts being as illustrated in FIG. 4. The tool is then rotated to its angled position, see FIG. 5, and retracted free of the partially mounted module. The module is thereafter fully mated to the circuit board.

The alignment and insertion tool of the invention could be tailored to any specifically configured module leads and spacings thereof. For optimum operative procedure, a kit of at least variously dimensioned alignment and inserter blades is provided.

It is anticipated that the tool of the invention could be incorporated into a fully automatic handling system.

Preferred embodiments of the invention have been described in detail for the purpose of illustration but it will be obvious that numerous modifications and variations may be resorted to without departing from the spirit of the invention in its broadest aspects.

It is understood that the term electronic module as used in the specification and claims herein is used in a broad sense and includes any electrical circuit device which has a spine or backing member from which project spaced rows of multiple pins, leads or posts adapted for insertion in mating apertures, terminals or sockets of any device with which the module is to be assembled or associated, such as printed circuit boards, printed circuit cards, mating connectors and the like. By way of illustration only, and not for the purpose of limitation, the alignment tool disclosed herein is especially adapted for use in aligning the wire wrap posts of card edge connectors for insertion into apertures provided in a printed circuit board or printed circuit card.

It is also within the scope of this invention that the tool may be used with any device having rows of multiple pins, leads or posts which require alignment to match the apertures provided in any mating device adapted to receive the rows of multiple pins.

What is claimed is:

1. A method for installing an electrical module on a printed circuit board or the like where the module comprises a flat body portion and two parallel rows of longitudinally spaced terminal leads insertable in correspondingly spaced rows of apertures in the board and where the leads may be required to be straightened and aligned before insertion, said method comprising the steps of:

a. applying the module to a tool which comprises an elongated planar blade and an integral handle offset from the blade and forming a longitudinal extension thereof, the blade having opposite parallel side edges perpendicular to the plane of said blade and a plurality of longitudinally spaced slots formed in each side edges, the longitudinal spacing of the slots of each edge corresponding to the correct longitudinal spacing of the leads in each row and the slots in the opposite side edges being transversely aligned and perpendicular to the plane of said blade, each of said slots being defined by an open front in one of said side edges, a pair of side walls extending inwardly from said open front and a rear wall connecting said side walls, the distance between rear walls of transversely aligned slots in said opposite side edges corresponding to the correct distance between transversely aligned leads in said two rows, and the distance between side walls of each slot at said open front being just sufficient to permit entry of one of said leads into said slot and the seating thereof against said rear wall, said step of applying said module to said tool comprising supporting the module with said leads extending upwardly from said body portion, holding said tool by said handle with the blade offset upwardly from said handle, positioning said blade in overlying relationship to said module with the slots in said opposite side edges approximately aligned with said two rows of leads, inclining and lowering said blade relative to said module so that said blade is positioned between said leads with one edge turned down toward the body of said module and the other edge turned upwardly away from the body of said module, turning said blade between said leads with said slots in said side edges in transverse alignment with said leads of said two rows of leads until said blade is parallel to and spaced outwardly from the body of said module and until said leads are seated in said slots whereby said leads in said two rows are forced into their correct longitudinal spacing and the tranversely aligned leads in said two rows are forced apart a distance, equal to at least the correct transverse distance between leads in said two rows, manipulating any leads extending outwardly from said slots into said slots, translating said blade toward but short of the free ends of said leads, b. with said module supported by said tool, turning said tool and module over until said leads extend downwardly from the body portion of said module, c. positioning said module supported by said tool and with said leads extended downwardly over a circuit board and aligning said two rows of leads over two rows of apertures in said circuit board, d. pressing said tool with said module supported thereon downwardly until said two rows of leads enter and extend through said two rows of apertures, e. rotating said blade to an inclined position relative to said leads and retracting said blade until it is free from the now partially mounted module, and f. pressing the body of said module toward said circuit board until it is fully installed thereon.

2. A method for installing an electrical module having a body portion and a pair of transversely spaced parallel rows of longitudinally spaced leads extending unidirectionally therefrom onto a module receiver having at least a pair of parallel rows of correspondingly spaced apertures for receiving said leads, said leads being characterized in that they are subject to bending in handling and may require straightening and aligning before insertion into said apertures, said method involving the use of a hand manipulatable tool having an elongated planar blade and an integral handle offset from the blade and forming a longitudinal extension thereof, the blade having a pair of opposite parallel side edges perpendicular to the plane of said blade and a plurality of longitudinally spaced slots formed in each side edge, said slots having predetermined dimensions and predetermined transverse and longitudinal spacings therebetween to align with said parallel rows of apertures in said module receiver and to align said rows of leads for insertion into said apertures when said leads are received in said slots, said method comprising the steps of:

a. inserting the tool blade between the pair of rows of leads of said module with the plane of said blade inclined at an angle to the planes of the rows of leads and with the slots in said opposite edges aligned with the leads in said pair of rows of leads;

b. rotating the blade to a position paralleling the module body portion to engage the slots in said opposite edges with the leads in said pair of rows of leads;

c. translating said blade toward the free end of the leads to thereby straighten and align the leads;

d. manipulating any leads which extend outwardly from said slots into said slots;

e. moving the assembled module and tool to a position relative to said module receiver whereby the ends of the leads in said parallel rows of leads are aligned with the apertures in said pair of parallel rows of apertures and pressing the assembled module and tool toward said module receiver to insert said leads of said parallel rows of leads into said apertures of said parallel rows of apertures;

f. rotating said tool blade to an inclined position relative to said pair of rows of leads wherein the slots in said opposite edges of said blade are out of engagement with said leads; and g. withdrawing said blade from between said pair of parallel rows of leads.

3. The method according to claim 2 wherein said module receiver is a circuit board.

4. The method according to claim 2 wherein said module receiver is a connector block and said apertures are sockets in said connector block.

5. The method according to claim 2 including the additional step of further pressing said module toward said module receiver after said tool blade is withdrawn from between said rows of leads.

* * * * *